(12) United States Patent
Tachibana

(10) Patent No.: US 12,745,444 B2
(45) Date of Patent: Sep. 22, 2026

(54) SEMICONDUCTOR DEVICE AND METHOD FOR MANUFACTURING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Fumihito Tachibana, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 240 days.

(21) Appl. No.: 18/453,654

(22) Filed: Aug. 22, 2023

(65) Prior Publication Data

US 2024/0072143 A1 Feb. 29, 2024

(30) Foreign Application Priority Data

Aug. 24, 2022 (JP) ................................ 2022-133568

(51) Int. Cl.
*H10D 64/27* (2025.01)
*H10D 62/832* (2025.01)
(Continued)

(52) U.S. Cl.
CPC ....... *H10D 64/513* (2025.01); *H10D 62/8325* (2025.01); *H10D 12/038* (2025.01); *H10D 12/481* (2025.01)

(58) Field of Classification Search
CPC ............ H10D 62/8325; H10D 64/513; H10D 12/038; H10D 12/481; H10D 30/0297;
(Continued)

(56) References Cited

U.S. PATENT DOCUMENTS 6,737,704 B1 * 5/2004 Takemori ............ H10D 64/252 257/329
2004/0166619 A1 8/2004 Takemori et al.
(Continued)

FOREIGN PATENT DOCUMENTS

JP 2012-049573 A 3/2012

*Primary Examiner* — Monica D Harrison
(74) *Attorney, Agent, or Firm* — Posz Law Group, PLC

(57) ABSTRACT

A semiconductor device includes a semiconductor substrate having a trench adjacent to an upper surface, a gate insulating film inside the trench, a gate electrode on the gate insulating film inside the trench, and an interlayer insulating film covering the gate electrode inside the trench. The semiconductor substrate has a connection surface that connects between the upper surface of the semiconductor substrate and a side surface of the trench and is located below the upper surface of the semiconductor substrate. An upper surface of the gate insulating film is located below the connection surface. An upper surface of the interlayer insulating film is located below the upper surface of the gate insulating film. A metal film is disposed to cover the upper surface of the semiconductor substrate, the connection surface, the upper surface of the gate insulating film, and the upper surface of the interlayer insulating film.

7 Claims, 6 Drawing Sheets

(51) Int. Cl.
*H10D 12/00* (2025.01)
*H10D 12/01* (2025.01)

(58) Field of Classification Search
CPC ............. H10D 30/668; H10D 64/2527; H10D 64/518; H10D 64/514; H10D 30/60
USPC .......................................................... 257/288
See application file for complete search history.

(56) References Cited

U.S. PATENT DOCUMENTS

| | | | | |
|---|---|---|---|---|
| 2006/0124996 | A1 | 6/2006 | Mizokuchi et al. | |
| 2008/0299727 | A1 | 12/2008 | Mizokuchi et al. | |
| 2010/0127322 | A1 * | 5/2010 | Mizokuchi ........... | H10D 64/513<br>257/330 |
| 2016/0359026 | A1 | 12/2016 | Matsuura | |
| 2018/0069110 | A1 | 3/2018 | Matsuura | |
| 2020/0098905 | A1 | 3/2020 | Naito | |
| 2021/0313459 | A1 | 10/2021 | Naito | |

* cited by examiner

SEMICONDUCTOR DEVICE AND METHOD FOR MANUFACTURING THE SAME

CROSS REFERENCE TO RELATED APPLICATION

The present application claims the benefit of priority from Japanese Patent Application No. 2022-133568 filed on Aug. 24, 2022. The entire disclosures of the above application are incorporated herein by reference.

TECHNICAL FIELD

The present disclosure relates to a semiconductor device and a method for manufacturing the same.

BACKGROUND

For example, there is known a semiconductor device including a semiconductor substrate, a trench provided in an upper surface of the semiconductor substrate, a gate insulating film and a gate electrode provided in the trench, and an interlayer insulating film covering an upper surface of the gate electrode. An upper surface of the interlayer insulating film is located below the upper surface of the semiconductor substrate. A metal film is disposed to cover a range that extends from the upper surface of the semiconductor substrate to the upper surface of the interlayer insulating film.

SUMMARY

The present disclosure describes a semiconductor device and a method for manufacturing the same. According to an aspect of the present disclosure, a semiconductor device includes a semiconductor substrate formed with a trench adjacent to an upper surface, a gate insulating film disposed inside the trench, a gate electrode disposed on the gate insulating film inside the trench, an interlayer insulating film covering the gate electrode inside the trench, and a metal film. The semiconductor substrate has a connection surface that connects between the upper surface of the semiconductor substrate and a side surface of the trench and is located below the upper surface of the semiconductor substrate. The gate insulating film has an upper surface located below the connection surface. The interlayer insulating film has an upper surface located below the upper surface of the gate insulating film. The metal film is disposed to cover the upper surface of the semiconductor substrate, the connection surface, the upper surface of the gate insulating film, and the upper surface of the interlayer insulating film.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1:
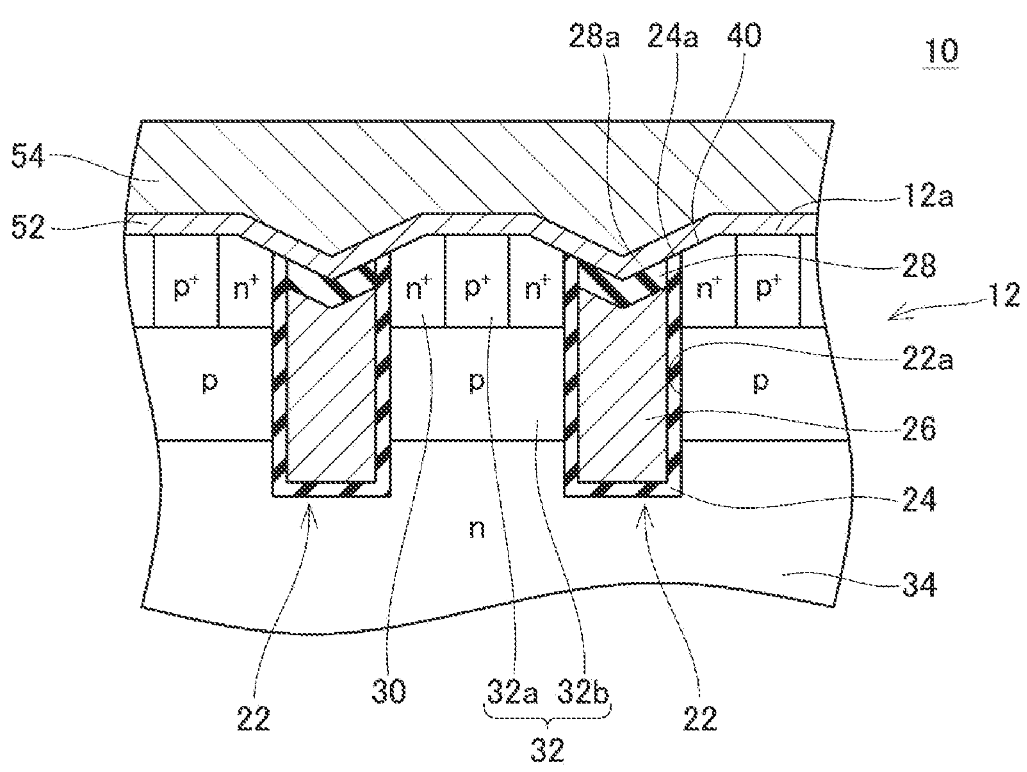
FIG. 1 is a cross-sectional view of a semiconductor device according to an embodiment of the present disclosure.

To begin with, a relevant technology will be described only for understanding the embodiments of the present disclosure.

For example, in a semiconductor device including a semiconductor substrate formed with a trench, a gate insulating film and a gate electrode provided in the trench, and an interlayer insulating film covering an upper surface of the gate electrode, an upper surface of the interlayer insulating film may be located below the upper surface of the semiconductor substrate, and a metal film may be disposed to cover a range over the upper surface of the semiconductor substrate and the upper surface of the interlayer insulating film. In such a configuration, since the interlayer insulating film is disposed inside the trench, the pitch of the trenches can be narrowed.

In such a semiconductor device, however, if there is a large step between the upper surface of the semiconductor substrate and the upper surface of the interlayer insulating film, the covering of the metal film is likely to be deteriorated at the step, and a step cut may occur in the metal film. The present disclosure provides a technique for improving a covering property of a metal film covering an upper surface of a semiconductor substrate and an upper surface of an interlayer insulating film in a semiconductor device in which the interlayer insulating film is disposed inside a trench.

According to an aspect of the present disclosure, a semiconductor device includes: a semiconductor substrate; a trench disposed in the semiconductor substrate adjacent to an upper surface of the semiconductor substrate; a gate insulating film covering an inner surface of the trench; a gate electrode disposed inside the trench, the gate electrode being insulated from the semiconductor substrate by the gate insulating film; an interlayer insulating film disposed inside the trench and covering an upper surface of the gate electrode; and a metal film. The semiconductor substrate has a connection surface connecting between the upper surface of the semiconductor substrate and a side surface of the trench. The connection surface of the semiconductor substrate is located below the upper surface of the semiconductor substrate. The gate insulating film has an upper surface that is located below the connection surface of the semiconductor substrate. The interlayer insulating film has an upper surface that is located below the upper surface of the gate insulating film. Further, the metal film is disposed to cover the upper surface of the semiconductor substrate, the connection surface of the semiconductor substrate, the upper surface of the gate insulating film, and the upper surface of the interlayer insulating film.

In the semiconductor device described above, the semiconductor substrate has the connection surface that connects between the upper surface of the semiconductor substrate and the side surface of the trench. The connection surface is located below the upper surface of the semiconductor substrate. The upper surface of the gate insulating film is located below the connection surface, and the upper surface of the interlayer insulating film is located below the upper surface of the gate insulating film. Namely, in the semiconductor device described above, the upper surface of the semiconductor substrate, the connection surface, the upper surface of the gate insulating film, and the upper surface of the interlayer insulating film are disposed so that the positions thereof gradually lower in this order. Therefore, the level difference between adjacent components is small, and the reliability of the metal film, that is, a covering property of the metal film covering these components can be improved.

According to an aspect of the present disclosure, a method for manufacturing a semiconductor device includes: forming a trench in a semiconductor substrate adjacent to an upper surface of the semiconductor substrate; forming a gate insulating film and a gate electrode, the gate electrode being formed on the gate insulating film in the trench to be insulated from the semiconductor substrate and to have an upper surface located below the upper surface of the semiconductor substrate inside the trench; forming an interlayer insulating film covering and extending over the upper surface of the semiconductor substrate and the upper surface of the gate electrode; etching the interlayer insulating film, the gate insulating film, and the semiconductor substrate using an etching gas so that the semiconductor substrate has a connection surface connecting between the upper surface of the semiconductor substrate and a side surface of the trench and locating below the upper surface of the semiconductor substrate, the gate insulating film has an upper surface locating below the connection surface, and the interlayer insulating film has an upper surface locating below the upper surface of the gate insulating film; and forming a metal film covering the upper surface of the semiconductor substrate, the connection surface of the semiconductor substrate, the upper surface of the gate insulating film, and the upper surface of the interlayer insulating film.

In the method described above, after the gate electrode is formed so that the upper surface thereof is located lower than the upper surface of the semiconductor substrate, the interlayer insulating film is formed so as to cover and extend over the upper surface of the semiconductor substrate and the upper surface of the gate electrode, that is, to cover a range above the upper surface of the semiconductor substrate and the upper surface of the gate electrode while spanning an area above the upper surface of the semiconductor substrate and an area above the upper surface of the gate electrode. Since the upper surface of the gate electrode is located lower than the upper surface of the semiconductor substrate, the interlayer insulating film having a substantially constant thickness is formed while maintaining the shapes of the upper surface of the semiconductor substrate and the upper surface of the gate electrode. That is, the upper surface of the interlayer insulating film is lowered at a part directly above the gate electrode than the other part. Thereafter, the interlayer insulating film, the gate insulating film, and the semiconductor substrate are etched using an etching gas, which is capable of etching the interlayer insulating film, the gate insulating film and the semiconductor substrate. Since the upper surface of the interlayer insulating film is lowered at the pat directly above the gate electrode than the other part, in the etching, a boundary portion between the upper surface of the semiconductor substrate and the side surface of the trench, which corresponds to a shoulder portion of the trench, is exposed first in the semiconductor substrate. Since the etching gas can etch the semiconductor substrate, the connection surface that is located below the upper surface of the semiconductor substrate and connects between the upper surface and the side surface of the trench is formed in the semiconductor substrate by etching the shoulder portion. In the etching, the gate insulating film and the interlayer insulating film are also etched such that the upper surface of the gate insulating film is located below the connection surface and the upper surface of the interlayer insulating film is located below the upper surface of the gate insulating film. That is, the etching is performed so that the upper surface of the semiconductor substrate, the connection surface, the upper surface of the gate insulating film, and the upper surface of the interlayer insulating film are configured to be gradually lowered in this order. Therefore, the level difference between the adjacent components is small. Accordingly, the covering property of the metal film subsequently formed can be improved.

In an embodiment of the present disclosure, in the semiconductor device described above, the connection surface, the upper surface of the gate insulating film, and the upper surface of the interlayer insulating film may be inclined so as to be displaced downward toward a center of the trench.

In such a configuration, the connection surface, the upper surface of the gate insulating film, and the upper surface of the interlayer insulating film are gradually displaced downward from the upper surface of the semiconductor substrate toward the center of the trench. Therefore, the covering property of the metal film can be further improved. In the above configuration, the upper surface of the semiconductor substrate and the side surface of the trench are connected by the inclined connection surface. Therefore, each of the upper surface of the semiconductor substrate, the connection surface, and the side surface of the trench has an obtuse angle at a connection portion with the adjacent component, and electric field concentration is alleviated. Therefore, the gate leakage current can be suppressed.

In an embodiment of the present disclosure, the semiconductor device may have a first step portion at a boundary between the connection surface and the upper surface of the gate insulating film, and a second step portion at a boundary between the upper surface of the gate insulating film and the upper surface of the interlayer insulating film.

In an embodiment of the present disclosure, in the semiconductor device described above, the semiconductor substrate may be a silicon carbide (SiC) substrate.

Hereinafter, embodiments of the present disclosure will be described in detail with reference to the drawings.

FIG. 1 shows a semiconductor device 10 of an embodiment. The semiconductor device 1 is, for example, a metal oxide semiconductor field effect transistor (MOSFET). The semiconductor device 10 includes a semiconductor substrate 12, electrodes, insulating films, and the like. The semiconductor substrate 12 is made of silicon carbide (SiC), for example. Note that the material of the semiconductor substrate 12 is not particularly limited, and may be another semiconductor material such as silicon (Si) or gallium nitride (GaN).

Figure 2:
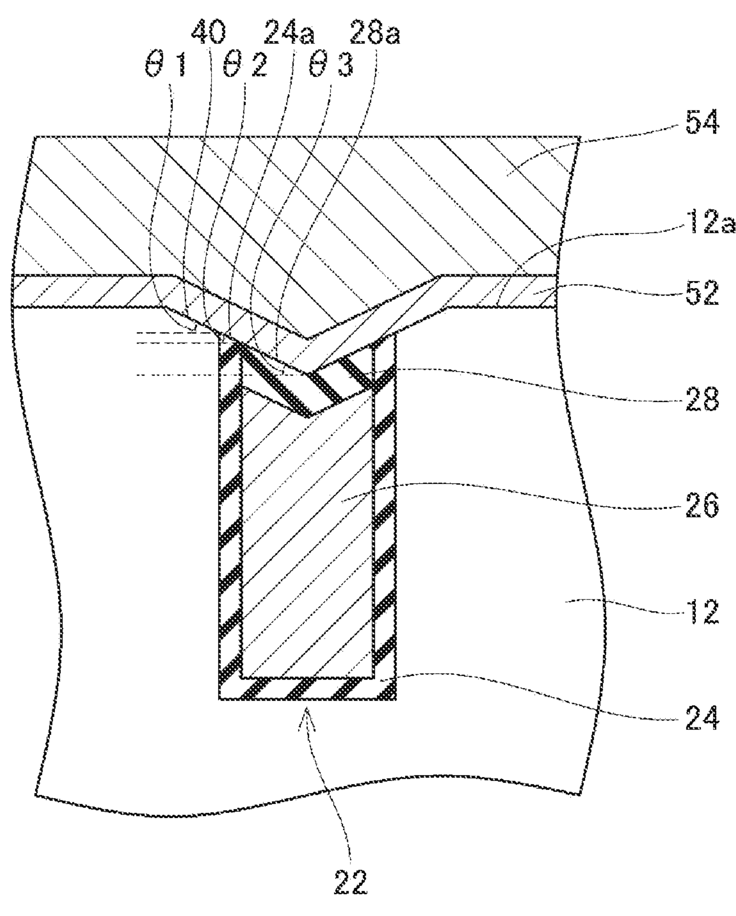
FIG. 2 is an enlarged cross-sectional view of the semiconductor device according to the embodiment.

The semiconductor substrate 12 is formed with multiple trenches 22 adjacent to an upper surface 12*a*. The trenches 22 extend along a direction perpendicular to the plane of FIG. 1 as a longitudinal direction. The trenches 22 extend parallel to each other. The semiconductor substrate 12 has a connection surface 40 between the upper surface 12*a* and a side surface 22*a* of the trench 22. The upper surface 12*a* of the semiconductor substrate 12 and the side surface 22*a* of the trench 22 are connected through the connection surface 40. The connection surface 40 locates below the upper surface 12a of the semiconductor substrate 12. That is, the connection surface 40 is positioned at a level lower than the upper surface 12a of the semiconductor substrate 12 with respect to a normal direction to the upper surface 12a of the semiconductor substrate 12. Specifically, the connection surface 40 is inclined so as to be displaced downward from the upper surface 12a of the semiconductor substrate 12 toward the center of the trench 22. In other words, the connection surface 40 slopes down from the upper surface 12a toward the center of the trench 22. As shown in FIG. 2, the connection surface 40 is inclined at an angle 61 with respect to the upper surface 12a of the semiconductor substrate 12. The value of the angle 61 is not particularly limited, but is, for example, in a range from 10° to 30°.

The inner surface of each of the trenches 22 is covered with the gate insulating film 24. An upper surface 24a of the gate insulating film 24 is located below the connection surface 40. Specifically, the upper surface 24a of the gate insulating film 24 is inclined so as to be displaced downward toward the center of the trench 22. In other words, the gate insulating film 24 has a top end that defines an inclined surface inclined downwardly toward the center of the trench 22, and the inclined surface corresponds to the upper surface 24a. As shown in FIG. 2, the upper surface 24a of the gate insulating film 24 is inclined at an angle 82 with respect to the upper surface 12a of the semiconductor substrate 12. The value of the angle 82 is not particularly limited, but is, for example, in a range from 10° to 30°.

A gate electrode 26 is disposed inside of each of the trenches 22. The gate electrode 26 covers the surface of the gate insulating film 24 except for the top end portion. The gate electrode 26 is insulated from the semiconductor substrate 12 by the gate insulation film 24. The gate electrode 26 has an upper surface that is inclined so as to be displaced downward toward the center of the trench 22.

An interlayer insulating film 28 is disposed inside of each of the trenches 22. The interlayer insulating film 28 covers the upper surface of the gate electrode 26. The upper surface 28a of the interlayer insulating film 28 locates below the upper surface 24a of the gate insulating film 24. Specifically, the upper surface 28a of the interlayer insulating film 28 is inclined so as to be displaced downward toward the center of the trench 22. As shown in FIG. 2, the upper surface 28a of the interlayer insulating film 28 is inclined at an angle 83 with respect to the upper surface 12a of the semiconductor substrate 12. The value of the angle 83 is not particularly limited, but is, for example, in a range from 10° to 30°. In the present embodiment, the angles 81 to 83 are substantially equal to each other. However, the angles 81 to 83 may have different values.

The upper surface 12a of the semiconductor substrate 12, the connection surface 40, the upper surface 24a of the gate insulating film 24, and the upper surface 28a of the interlayer insulating film 28 are covered with a barrier metal layer 52 as a metal film. The barrier metal layer 52 is formed of, for example, a laminated film of titanium (Ti) and titanium nitride (TiN). The barrier metal layer 52 is disposed along the upper surface 12a of the semiconductor substrate 12, the connection surface 40, the upper surface 24a of the gate insulating film 24, and the upper surface 28a of the interlayer insulating film 28 with a substantially constant thickness following these shapes. That is, the barrier metal layer 52 continuously extends along the shapes of the upper surface 12a of the semiconductor substrate 12, the connection surface 40, the upper surface 24a of the gate insulating film 24, and the upper surface 28a of the interlayer insulating film 28. An upper electrode 54 is disposed on an upper surface of the barrier metal layer 52. The upper electrode 54 is made of aluminum silicon (AlSi), for example. The barrier metal layer 52 and the upper electrode 54 constitute a source electrode.

As shown in FIG. 1, multiple source regions 30, a body region 32, and a drift region 34 are provided inside the semiconductor substrate 12.

Each of the source regions 30 is an n-type region. Each source region 30 is disposed at a position exposed on the upper surface 12a of the semiconductor substrate 12. Each source region 30 is in contact with the barrier metal layer 52. Each source region 30 is in contact with the gate insulating film 24 on the side surface 22a of the corresponding trench 22.

The body region 32 is a p-type region. The body region 32 is in contact with each source region 30. The body region 32 includes a contact region 32a and a main body region 32b. The contact region 32a has a p-type impurity concentration higher than that of the main body region 32b. The contact region 32a is interposed between the two source regions 30. The contact region 32a is in contact with the barrier metal layer 52. The main body region 32b is located under the source regions 30 and the contact region 32a. The main body region 32b is in contact with the gate insulating films 24 on the side surfaces 22a of the trenches 22. The main body region 32b is in contact with the gate insulating films 24 under the source regions 30.

The drift region 34 is an n-type region. The drift region 34 is disposed under the body region 32. The drift region 34 is separated from the source regions 30 by the body region 32. The drift region 34 is in contact with the gate insulating film 24 at the side surface 22a and the bottom surface of the trench 22. The drift region 34 is in contact with the gate insulating film 24 on a lower side of the body region 32.

Although not illustrated, a drain region having an n-type impurity concentration higher than that of the drift region 34 is provided below the drift region 34. The drain region is exposed on a lower surface of the semiconductor substrate 12. The lower surface of the semiconductor substrate 12 is covered with a drain electrode.

When the semiconductor device 10 is used, the semiconductor device 10 is connected in series to a load (e.g., a motor) and a power supply. A power supply voltage is applied to the semiconductor device 10 in a direction in which the drain electrode has a higher potential than the source electrode. When a gate-on potential, which is higher than a gate threshold, is applied to the gate electrode 26, a channel (inversion layer) is formed in the main body region 32b in a range that is in contact with the gate insulating film 24, and the semiconductor device 10 is turned on. When a gate-off potential, which is equal to or lower than the gate threshold, is applied to the gate electrode 26, the channel disappears and the semiconductor device 10 is turned off.

In the semiconductor device 10 of the present embodiment, as described above, the semiconductor substrate 12 includes the connection surface 40 that connects between the upper surface 12a of the semiconductor substrate 12 and the side surface 22a of the trench 22. The connection surface 40 is located below the upper surface 12a of the semiconductor substrate 12. Further, the upper surface 24a of the gate insulating film 24 is located below the connection surface 40, and the upper surface 28a of the interlayer insulating film 28 is located below the upper surface 24a of the gate insulating film 24. Specifically, the connection surface 40, the upper surface 24a of the gate insulating film 24, and the upper surface 28*a* of the interlayer insulating film 28 are inclined so as to be gradually displaced downward from the upper surface 12*a* of the semiconductor substrate 12 toward the center of the trench 22. In the semiconductor device 10 of the present embodiment, in this way, the upper surface 12*a* of the semiconductor substrate 12, the connection surface 40, the upper surface 24*a* of the gate insulating film 24, and the upper surface 28*a* of the interlayer insulating film 28 are provided so as to gradually lower in this order toward the center of the trench 22. Therefore, the level difference between adjacent components is small, and the covering property of the barrier metal layer 52 covering these components can be improved.

In the semiconductor device 10 of the present embodiment, the upper surface 12*a* of the semiconductor substrate 12 and the side surface 22*a* of the trench 22 are connected by the inclined connection surface 40. Therefore, the connection portion between the upper surface 12*a* of the semiconductor substrate 12 and the connection surface 40 forms an obtuse angle. Also, the connection portion between the connection surface 40 and the side surface 22*a* of the trench 22 forms an obtuse angle. Therefore, the electric field concentration is suppressed at these connection portions. As such, the gate leakage current can be suppressed.

Figure 3:
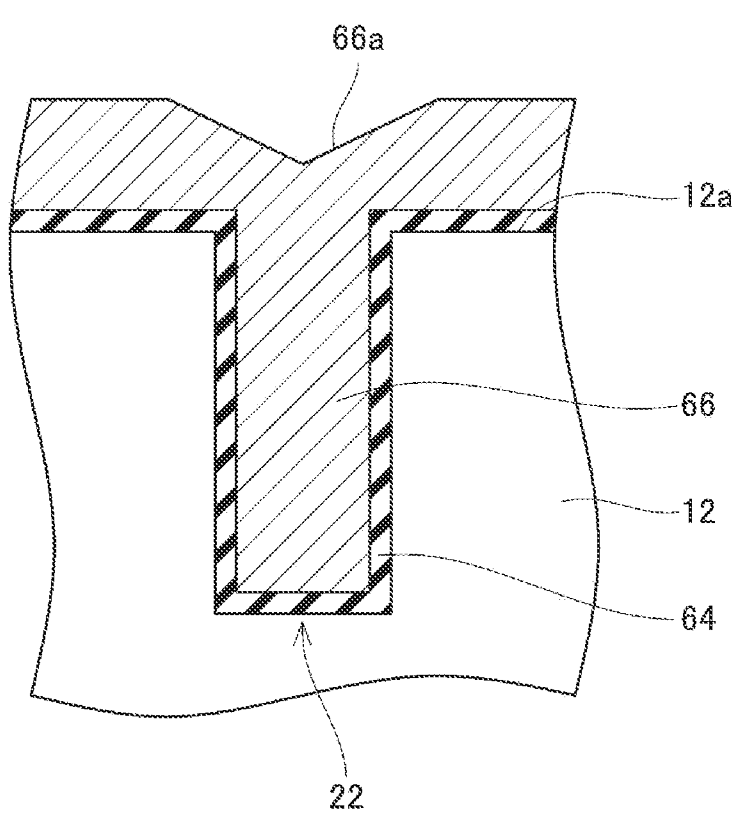
FIG. 3 is an enlarged cross-sectional view for explaining a manufacturing process of the semiconductor device according to the embodiment.

Next, a method for manufacturing the semiconductor device 10 will be described with reference to FIGS. 3 to 8. In FIGS. 3 to 8, configurations of some parts of the semiconductor substrate 12 constituting the MOSFET, such as the source region 30, and the body region 32 and the like, are not illustrated for the sake of simplicity. First, as shown in FIG. 3, a trench 22 is formed on the upper surface 12*a* of the semiconductor substrate 12. Then, an insulating film 64 is formed to cover a range including above the upper surface 12*a* of the semiconductor substrate 12 and the inner surface of the trench 22. Next, a polysilicon layer 66 is formed over the entire surface of the insulating film 64, so that the trench 22 is filled with the polysilicon layer 66. In this process, since the trench 22 has a depth, a depression 66*a* is formed on an upper surface of the polysilicon layer 66 at a position above the trench 22.

Figure 4:
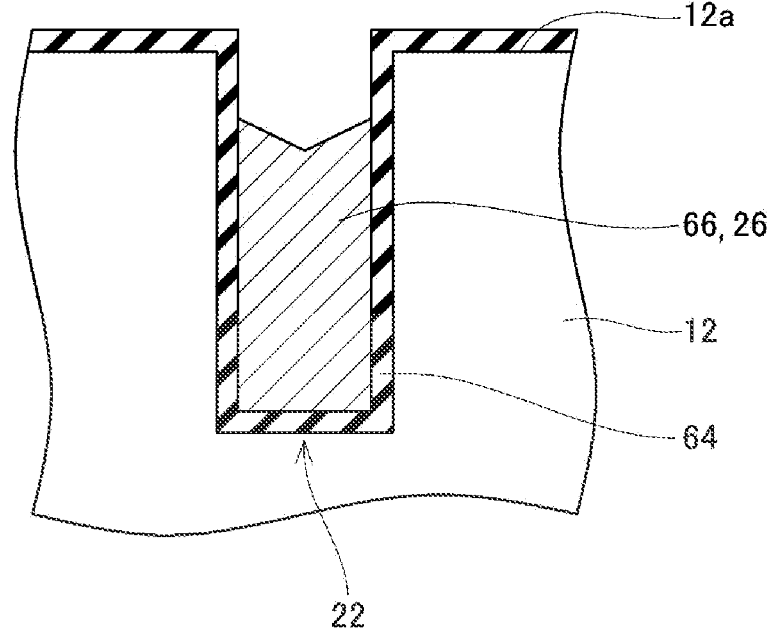
FIG. 4 is an enlarged cross-sectional view for explaining the manufacturing process of the semiconductor device according to the embodiment.

Next, as shown in FIG. 4, the polysilicon layer 66 is etched to be left in the trench 22, thereby to form the gate electrode 26 inside the trench 22. In this case, the polysilicon layer 66 is etched until the level of the upper surface of the polysilicon layer 66 becomes lower than the level of the upper surface 12*a* of the semiconductor substrate 12. In this process, since the polysilicon layer 66 before the etching has the depression 66*a* above the trench 22 (see FIG. 3), the etching of the polysilicon layer 66 proceeds while keeping the shape of the depression 66*a*. As a result, as shown in FIG. 4, the upper surface of the polysilicon layer 66 after the etching also has the similar shape to the depression 66*a*. That is, the upper surface of the polysilicon layer 66 remaining inside the trench 22 has a shape inclined so as to be displaced downward toward the center of the trench 22. The polysilicon layer 66 remaining inside the trench 22 becomes the gate electrode 26.

Figure 5:
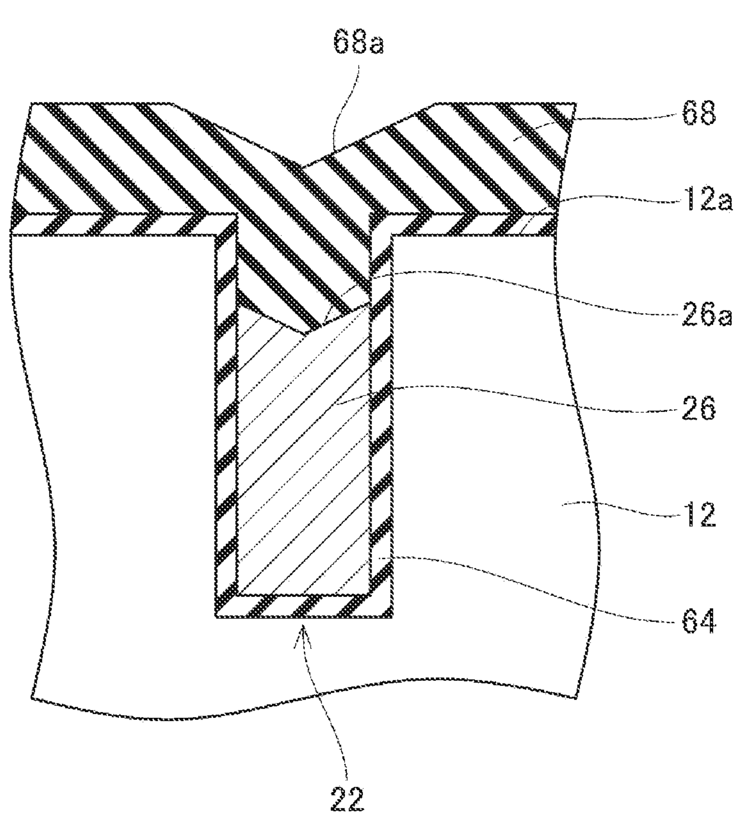
FIG. 5 is an enlarged cross-sectional view for explaining the manufacturing process of the semiconductor device according to the embodiment.

Next, as shown in FIG. 5, an insulating film 68 is formed to cover a range over the surface of the insulating film 64 and the upper surface of the gate electrode 26. That is, the insulating film 68 is formed to extend an area above the surface of the insulating film 64 to an area above the upper surface of the gate electrode 26. The insulating film 68 is formed along the upper surface of the insulating film 64 and the upper surface of the gate electrode 26. The insulating film 68 is formed with a substantially constant thickness along the shapes of the upper surface of the insulating film 64 and the upper surface of the gate electrode 26. Therefore, on the gate electrode 26, the upper surface of the insulating film 68 has a shape following the upper surface 26*a* of the gate electrode 26. That is, the upper surface of the insulating film 68 has a shape including the depression 68*a* above the gate electrode 26.

Figure 6:
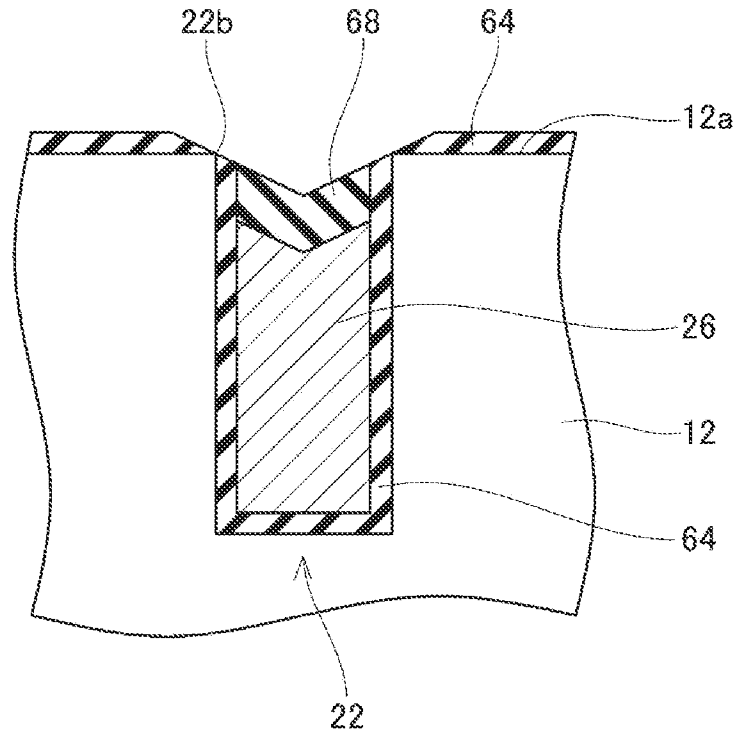
FIG. 6 is an enlarged cross-sectional view for explaining the manufacturing process of the semiconductor device according to the embodiment.
Figure 7:
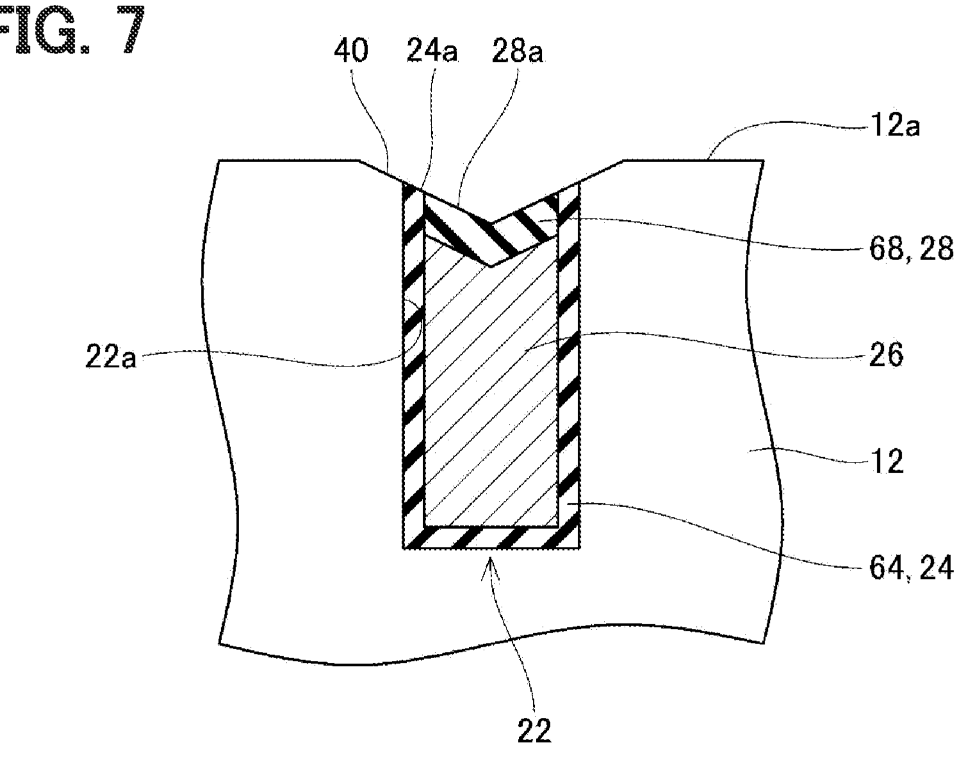
FIG. 7 is an enlarged cross-sectional view for explaining the manufacturing process of the semiconductor device according to the embodiment.

Next, the insulating film 68 is dry-etched. In the etching, for example, a mixed gas of $C_4F_8$ and $O_2$ is used as an etching gas. Since the upper surface of the insulating film 68 is formed with the depression 68*a* (see FIG. 5), in the process of etching the insulating film 68, a shoulder portion 22*b* of the trench 22 is exposed first in the semiconductor substrate 12, as shown in FIG. 6. At this time, the shoulder portion 22*b* corresponds to a corner or edge portion between the side surface 22*a* of the trench 22 and the upper surface 12*a* of the semiconductor substrate 12. The mixed gas of $C_4F_8$ and $O_2$ is a gas capable of etching the semiconductor substrate 12 and the insulating film 64. Therefore, when the etching is continued thereafter, as shown in FIG. 7, the shoulder portion 22*b* is etched as well as the insulating film 64 is etched. In this process, the etching is performed until the part of the insulating film 64 covering the upper surface 12*a* of the semiconductor substrate 12 is removed, that is, until the upper surface 12*a* of the semiconductor substrate 12 is exposed. As a result, the connection surface 40 that connects between the upper surface 12*a* of the semiconductor substrate 12 and the side surface 22*a* of the trench 22 is formed. The remainder of the insulating film 64 becomes the gate insulating film 24, and the remainder of the insulating film 68 becomes the interlayer insulating film 28. In this process, the etching of the semiconductor substrate 12, the insulating film 64, and the insulating film 68 proceeds while maintaining the shape of the depression 68*a* formed in the upper surface of the insulating film 68. Therefore, the connection surface 40, the upper surface 24*a* of the gate insulating film 24, and the upper surface 28*a* of the interlayer insulating film 28 after the etching have shapes according with the shape of the depression 68*a*.

Figure 8:
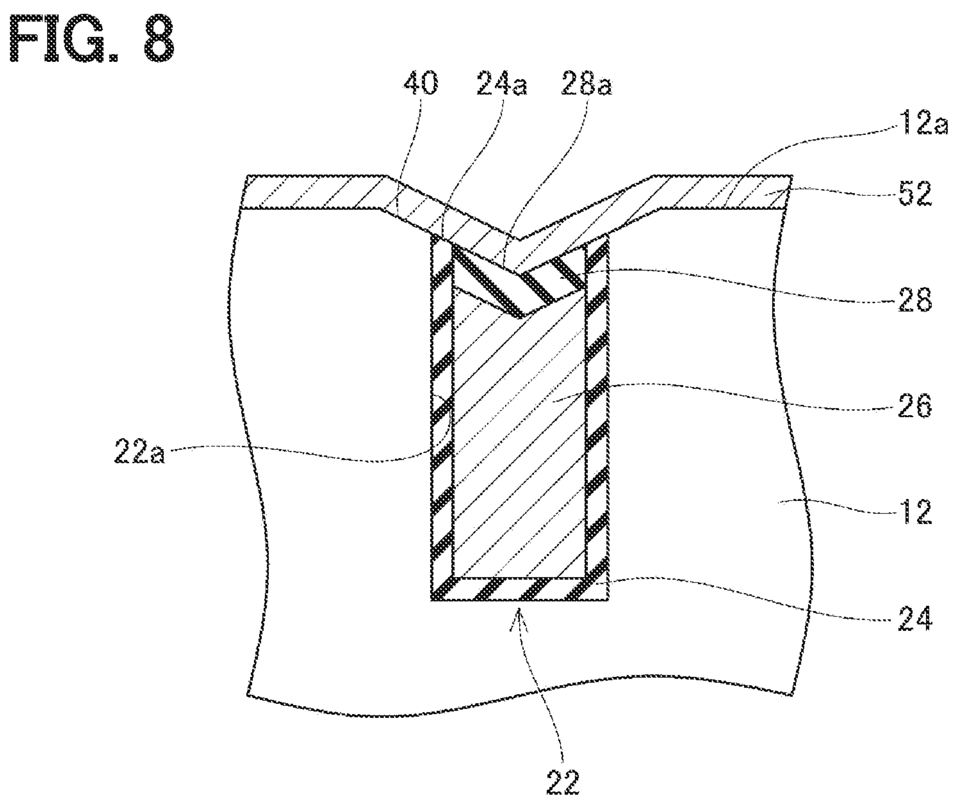
FIG. 8 is an enlarged cross-sectional view for explaining the manufacturing process of the semiconductor device according to the embodiment.

Next, as shown in FIG. 8, a barrier metal layer 52 is formed in a range extending over the upper surface 12*a* of the semiconductor substrate 12, the connection surface 40, the upper surface 24*a* of the gate insulating film 24, and the upper surface 28*a* of the interlayer insulating film 28. The connection surface 40, the upper surface 24*a* of the gate insulating film 24, and the upper surface 28*a* of the interlayer insulating film 28 are inclined so as to be displaced downward toward the center of the trench 22, and these surfaces are relatively smoothly connected to each other. Therefore, the upper surface 12*a*, the connection surface 40, the upper surface 24*a* of the gate insulating film 24, and the upper surface 28*a* of the interlayer insulating film 28 can be covered with the barrier metal layer 52 without a gap. That is, the upper surface 12*a*, the connection surface 40, the upper surface 24*a* of the gate insulating film 24, and the upper surface 28*a* of the interlayer insulating film 28 can be continuously covered with the barrier metal layer 52. Thereafter, an upper electrode 54, a drain electrode, and the like are formed, and the manufacturing process of the semiconductor device 10 is then completed.

In the manufacturing method described above, the processes shown in FIGS. 3 to 8 may be performed on the semiconductor substrate 12 on which the structure of the MOSFET has been formed in advance. Alternatively, the structure of the MOSFET may be formed in the semiconductor substrate 12 after the process shown in FIG. 7.

Figure 9:
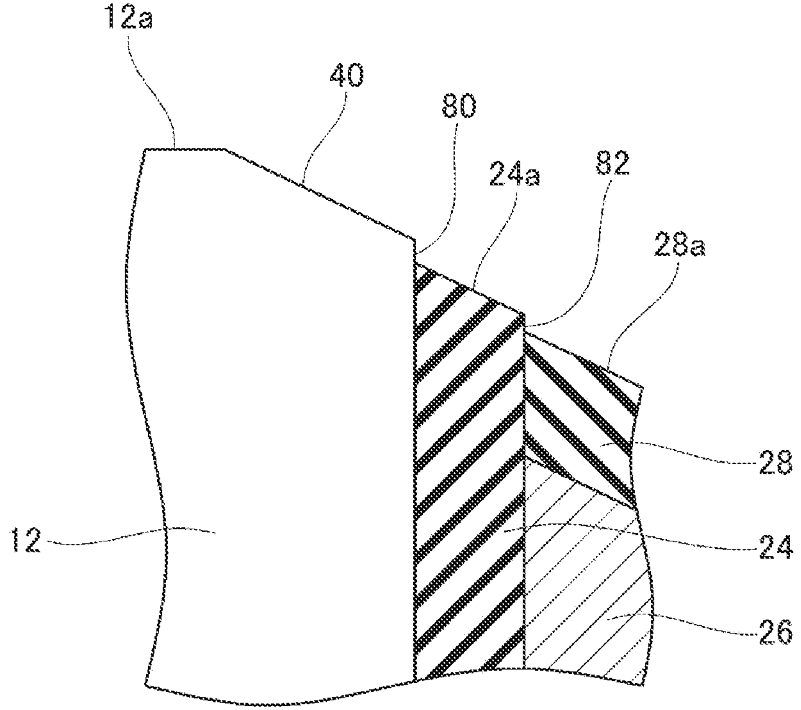
FIG. 9 is an enlarged cross-sectional view of a main part of a semiconductor device according to a modification.

In the embodiment described above, the connection surface 40, the upper surface 24*a* of the gate insulating film 24, and the upper surface 28*a* of the interlayer insulating film 28 form a smoothly connected inclined surface. As another example, as illustrated in FIG. 9, a step portion 80 may be provided at the boundary between the connection surface 40 and the upper surface 24*a* of the gate insulating film 24, and a step portion 82 may be provided at the boundary between the upper surface 24*a* of the gate insulating film 24 and the upper surface 28*a* of the interlayer insulating film 28. The semiconductor substrate 12, the gate insulating film 24, and the interlayer insulating film 28 have different etching rates. Specifically, the etching rate increases in the order of the semiconductor substrate 12, the gate insulating film 24, and the interlayer insulating film 28. Therefore, in the processes of performing the dry etching shown in FIGS. 6 and 7, the step portions 80 and 82 as shown in FIG. 9 may be generated. The height of each of the step portions 80 and 82 is, for example, 10 nm or less. Even in such a configuration, since the level difference between adjacent components is still smaller, for example, smaller than that in that of a related art, it is possible to ensure the covering property of the barrier metal layer 52.

In the embodiment described above, the semiconductor device is a MOSFET, as an example. However, the semiconductor device may be, for example, an IGBT or a diode.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve multiple objectives at the same time, and achieving one of the objectives itself has technical usefulness.

What is claimed is:

1. A semiconductor device comprising:

a semiconductor substrate;

a trench disposed in the semiconductor substrate adjacent to an upper surface of the semiconductor substrate;

a gate insulating film covering an inner surface of the trench;

a gate electrode disposed inside the trench, the gate electrode being insulated from the semiconductor substrate by the gate insulating film, an interlayer insulating film disposed inside the trench and covering an upper surface of the gate electrode; and a metal film, wherein the semiconductor substrate has a connection surface connecting between the upper surface of the semiconductor substrate and a side surface of the trench, the connection surface of the semiconductor substrate is located below the upper surface of the semiconductor substrate, the gate insulating film has an upper surface that is located below the connection surface of the semiconductor substrate, the interlayer insulating film has an upper surface that is located below the upper surface of the gate insulating film, the metal film is disposed to cover the upper surface of the semiconductor substrate, the connection surface of the semiconductor substrate, the upper surface of the gate insulating film, and the upper surface of the interlayer insulating film, and the connection surface of the semiconductor substrate, the upper surface of the gate insulating film, and the upper surface of the interlayer insulating film are each inclined to be displaced downward toward a center of the trench.

2. The semiconductor device according to claim 1, wherein the connection surface of the semiconductor substrate and the upper surface of the gate insulating film define a first step portion at a boundary therebetween, and the upper surface of the gate insulating film and the upper surface of the interlayer insulating film defines a second step portion at a boundary therebetween.

3. The semiconductor device according to claim 1, wherein the semiconductor substrate is made of silicon carbide.

4. The semiconductor device according to claim 1, wherein the connection surface of the semiconductor substrate, the upper surface of the gate insulating film, and the upper surface of the interlayer insulating film are inclined linearly toward the center of the trench.

5. The semiconductor device according to claim 1, wherein each of the connection surface of the semiconductor substrate, the upper surface of the gate insulating film, and the upper surface of the interlayer insulating film are inclined at an angle of 10° to 30° with respect to the upper surface of the semiconductor substrate.

6. The semiconductor device according to claim 1, wherein the metal film is inclined linearly and downwardly from a position above the connection surface of the semiconductor substrate toward the center of the trench.

7. A method for manufacturing a semiconductor device, the method comprising:

forming a trench in a semiconductor substrate adjacent to an upper surface of the semiconductor substrate;

forming a gate insulating film and a gate electrode, the gate electrode being formed on the gate insulating film inside the trench to be insulated from the semiconductor substrate and to have an upper surface locating below the upper surface of the semiconductor substrate inside the trench;

forming an interlayer insulating film extending above the upper surface of the semiconductor substrate and the upper surface of the gate electrode;

etching the interlayer insulating film, the gate insulating film, and the semiconductor substrate using an etching gas so that the semiconductor substrate has a connection surface connecting between the upper surface of the semiconductor substrate and a side surface of the trench and locating below the upper surface of the semiconductor substrate, the gate insulating film has an upper surface locating below the connection surface, the interlayer insulating film has an upper surface locating below the upper surface of the gate insulating film, the connection surface of the semiconductor substrate, the upper surface of the gate insulating film, and the upper surface of the interlayer insulating film are each inclined to be displaced downward toward a center of the trench; and forming a metal film covering the upper surface of the semiconductor substrate, the connection surface of the semiconductor substrate, the upper surface of the gate insulating film, and the upper surface of the interlayer insulating film.

* * * * *